US009229029B2

(12) United States Patent
Breinlinger

(10) Patent No.: US 9,229,029 B2
(45) Date of Patent: Jan. 5, 2016

(54) HYBRID ELECTRICAL CONTACTOR

(71) Applicant: FormFactor, Inc., Livermore, CA (US)

(72) Inventor: Keith J. Breinlinger, Livermore, CA (US)

(73) Assignee: FormFactor, Inc., Livermore, CA (US)

( * ) Notice: Subject to any disclaimer, the term of this patent is extended or adjusted under 35 U.S.C. 154(b) by 427 days.

(21) Appl. No.: 13/681,896

(22) Filed: Nov. 20, 2012

(65) Prior Publication Data

US 2013/0135001 A1 May 30, 2013

Related U.S. Application Data

(60) Provisional application No. 61/564,679, filed on Nov. 29, 2011.

(51) Int. Cl.

| | |
|---|---|
| ***G01R 31/20*** | (2006.01) |
| ***G01R 1/067*** | (2006.01) |
| ***G01R 1/073*** | (2006.01) |
| *G01R 31/28* | (2006.01) |

(52) U.S. Cl.
CPC ............ *G01R 1/067* (2013.01); *G01R 1/07342* (2013.01); *G01R 1/07378* (2013.01); *G01R 31/2889* (2013.01)

(58) Field of Classification Search
None
See application file for complete search history.

(56) References Cited

U.S. PATENT DOCUMENTS

| | | | | |
|---|---|---|---|---|
| 4,429,323 | A * | 1/1984 | Ohtsuka | 347/111 |
| 6,242,932 | B1 * | 6/2001 | Hembree | 324/756.02 |
| 6,535,002 | B2 * | 3/2003 | Haseyama et al. | 324/756.02 |
| 6,840,374 | B2 | 1/2005 | Khandros et al. | |
| 6,988,310 | B2 * | 1/2006 | Advocate et al. | 29/825 |
| 7,218,127 | B2 | 5/2007 | Cooper et al. | |
| 7,267,559 | B2 | 9/2007 | Hashitani et al. | |
| 7,759,951 | B2 * | 7/2010 | Karklin et al. | 324/762.06 |
| 7,837,494 | B2 | 11/2010 | Vich | |
| 7,922,516 | B2 | 4/2011 | Temblador et al. | |
| 7,944,674 | B2 | 5/2011 | McCahon et al. | |
| 2002/0043980 | A1 | 4/2002 | Rincon et al. | |
| 2007/0007983 | A1 * | 1/2007 | Salmon | 324/765 |
| 2009/0009199 | A1 | 1/2009 | Stutzman et al. | |
| 2011/0193581 | A1 | 8/2011 | Amaro et al. | |

FOREIGN PATENT DOCUMENTS

| | | |
|---|---|---|
| EP | 1408338 | 4/2004 |
| JP | 2002-196019 | 7/2002 |

OTHER PUBLICATIONS

"Matrix BGA Socket Assembly Instructions," Tyco Electronics (MPI-31758-01 Rev. 2) (publication date unknown but predates Nov. 29, 2011), 11 pages.
"The HXC125 Material System," TE Connectivity (publication date unknown but was downloaded from the Internet on Nov. 9, 2011), 1 page.
International Search Report and Written Opinion of the International Searching Authority, PCT/US2012/066807 (Mar. 12, 2013) 16 pages.
International Report on Patentability, PCT/US2012/066807 (Jun. 3, 2014) 6 pages.

* cited by examiner

*Primary Examiner* — Minh N Tang
(74) *Attorney, Agent, or Firm* — Kirton McConkie

(57) ABSTRACT

An electrical connection between an electrically conductive probe on one device and a compliant pad on another device can be formed by piercing the compliant pad with the probe. The probe can contact multiple electrically conductive elements inside the pad and thereby electrically connect to the pad at multiple locations inside the pad.

20 Claims, 11 Drawing Sheets

1200
1202
1204
1206
1208
1210
1212

HYBRID ELECTRICAL CONTACTOR

CROSS REFERENCE TO RELATED APPLICATION(S)

This application is a non-provisional (and thus claims the benefit of the filing date) of U.S. provisional patent application Ser. No. 61/564,679, which was filed Nov. 29, 2011 and is incorporated herein by reference in its entirety.

BACKGROUND

A variety of techniques exist to connect electrically two or more electronic devices. One type of well known electrical connection technique is solder. Electrical connections consisting of solder between to electronic devices are generally reliable and have a relatively low electrical resistance. Also, once solder connections between electronic devices are made, the solder connections do not typically exert forces on either of the electronic devices. Solder connections, however, have some disadvantages. For example, solder connections between electronic devices cannot easily be undone and remade between one of the electronic devices and a different electronic device. As another example, solder connections typically do not allow appreciable relative movement between the electronic devices, and in fact, relative movement between the electronic devices (e.g., due to mismatched thermal expansion or contraction of the electronic devices) can break the solder connections.

Pressure based electrical connections in which an electrically conductive probe on one electronic device is pressed against a contact on another electronic device overcomes some of the disadvantages of solder connections. For example, such pressured based electrical connections are readily undone and reformed between one electronic device and a different electronic device. Also, the probe on one electronic device can typically slide with respect to the contact on the other electronic device in response to relative movement between the electronic devices. There are, however, disadvantages to pressure based electrical connections. For example, the electrical resistance of pressured based electrical connections is typically greater than that of solder connections. As another example, pressured based electrical connections, by definition, require a given amount of force between the probe on one electronic device and the contact on the other electronic device.

Other types of electrical connections also suffer from disadvantages. For example, mechanical force fitting electrical connections (e.g., zero insertion force connectors) often require secondary actuators and typically provide a relatively low density of individual connections. As another example, liquid metals can be difficult to contain and control and typically can be used only in relatively narrow temperature ranges.

Various embodiments of the present invention address one or more of the foregoing disadvantages in prior art electrical connection techniques.

SUMMARY

In some embodiments of the invention, an electronic apparatus can include a first electronic device having first circuitry. The electronic apparatus can also include compliant pads, and electrically conductive probes piercing the pads. There can be electrical paths from the first circuitry, and each of the electrical paths can include electrical connections formed by one of the probes at a plurality of locations inside one of the pads pierced by the probe.

In some embodiments of the invention, a process of electrically connecting electronic devices can include piercing with electrically conductive probes electrically connected to first circuitry of a first electronic device compliant pads that are electrically connected to second circuitry of a second electronic device. Moreover, for each pair of one of the probes and a corresponding one of the pads, the piercing comprises contacting electrically conductive elements of the corresponding pad to complete an electrically conductive path through the probe and the corresponding pad from the first circuitry to the second circuitry.

In some embodiments of the invention, a probe card assembly can include a wiring substrate, which can include an electrical interface to a tester for controlling testing of an electronic device under test (DUT). The probe card assembly can also include a probe head that includes electrically conductive contacts configured to connect electrically to terminals of the DUT. The probe card assembly can also include an interconnector, which can include compliant pads configured to provide electrical paths between the wiring substrate and the probe head. Each of the electrical paths can include electrical connections formed at a plurality of locations inside one of the pads.

DETAILED DESCRIPTION OF EXEMPLARY EMBODIMENTS

Figure 1A:
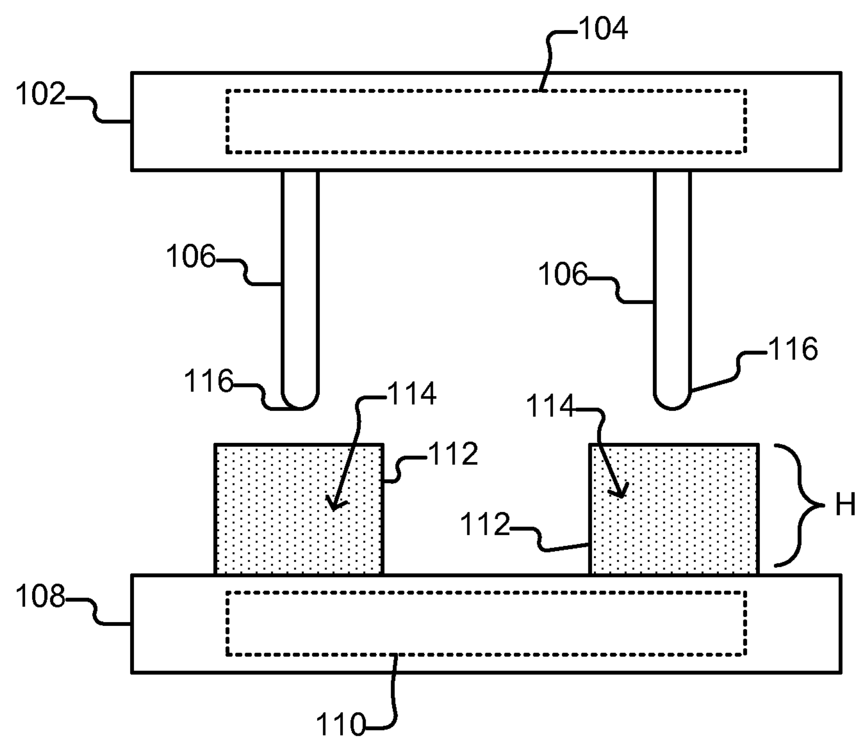
FIGS. 1A and 1B illustrate formation of electrical connections in which electrically conductive probes pierce pads comprising electrically conducive elements according to some embodiments of the invention.

This specification describes exemplary embodiments and applications of the invention. The invention, however, is not limited to these exemplary embodiments and applications or to the manner in which the exemplary embodiments and applications operate or are described herein. Moreover, the Figures may show simplified or partial views, and the dimensions of elements in the Figures may be exaggerated or otherwise not in proportion for clarity. In addition, as the terms "on," "attached to," or "coupled to" are used herein, one object (e.g., a material, a layer, a substrate, etc.) can be "on," "attached to," or "coupled to" another object regardless of whether the one object is directly on, attached, or coupled to the other object or there are one or more intervening objects between the one object and the other object. Also, directions (e.g., above, below, top, bottom, side, up, down, under, over, upper, lower, horizontal, vertical, "x," "y," "z," etc.), if provided, are relative and provided solely by way of example and for ease of illustration and discussion and not by way of limitation. In addition, where reference is made to a list of elements (e.g., elements a, b, c), such reference is intended to include any one of the listed elements by itself, any combination of less than all of the listed elements, and/or a combination of all of the listed elements.

As used herein, circuitry means passive and/or active electrical circuitry. Passive circuitry refers to a collection of interconnected electrically conductive vias, wires, traces, or other electrically conductive structures that provide electrical paths through which electrical signals can pass. Active circuitry refers to a collection of interconnected electrical elements such as switches, transistors, amplifiers, or the like that process, operate on, or alter electrical signals or the paths of electrical signals.

As used herein, the term elements refers to a plurality of structurally distinct individual elements.

As used herein, blade refers to a structure with a cutting edge having a length that is greater than any width of the cutting edge. The edge can be sharpened to essentially a line or can be dull and thus constitute a surface such as a flat surface.

As used herein, compliant means able to move or give in response to a force. The term compliant covers plastic deformation and/or elastic deformation. Plastic deformation refers to deformation—i.e., a change in shape or position—of an object in response to a force from which the object does not completely recover after removal of the force. A structure that elastically deforms in response to a force recovers substantially its original shape or position after removal of the force. An object that elastically deforms is referred to herein as being elastic or an elastic object.

As used herein, pierce means to force or make a way into or through. Thus, a probe that pierces a pad forces or makes a way into or through the pad.

Elongated Means Relatively Long and Thin.

Embodiments of the invention include electrical connections comprising an electrically conductive probe that pierces a compliant pad. The probe can contact multiple electrically conductive elements inside the pad and thereby electrically connect to the pad at multiple locations inside the pad.

Figure 1B:
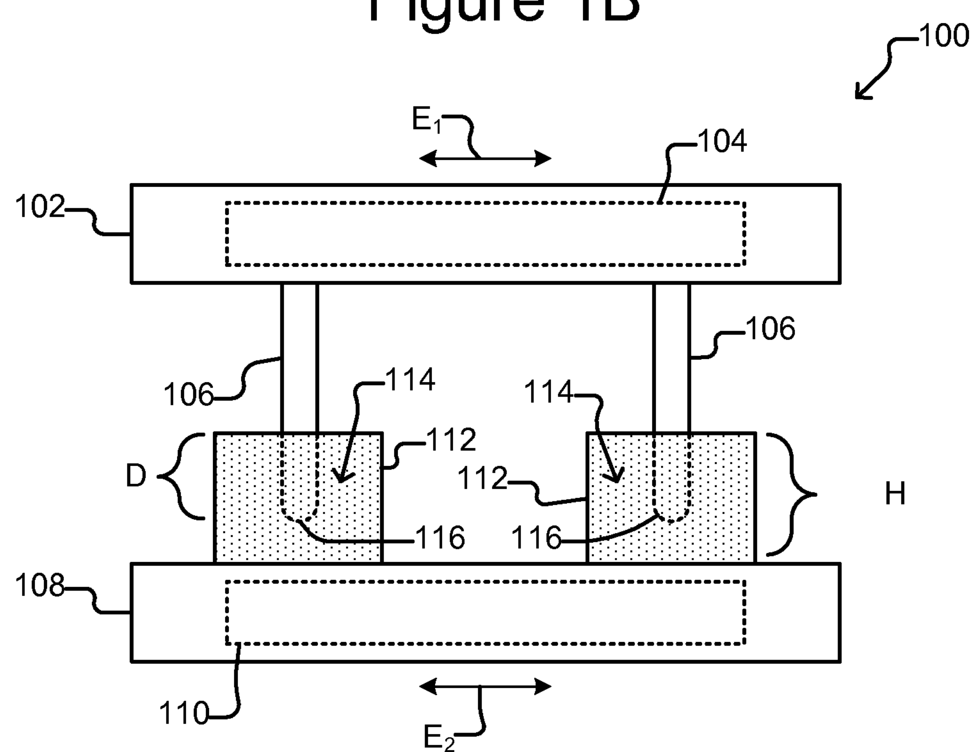

FIGS. 1A and 1B illustrate making an electrical connection between a first electronic device 102 and a second electronic device 108 according to some embodiments of the invention. As shown, electrically conductive probes 106 can pierce (and thus penetrate into) pads 112, each of which can comprise electrically conductive elements 114. (Although two probes 106 and two pads 112 are shown, there can be more of fewer.) Each probe 106 can contact multiple conductive elements 114 in a pad 112 and thereby make multiple electrical connections with the conductive elements 114 inside the pad 112. The conductive elements 114 can be of sufficient density inside the pads 112 that electrical connections are created between the probe 106 and the conductive elements 114 inside the pad 112 pierced by the probe 106. The probes 106 and pads 112 pierced by the probes can thus be part of continuous electrical paths (which can be electrically insulated one from another) from the first electronic device 102 to the second electronic device 108. Although not shown, the probes 106 in FIGS. 1A and 1B (or any other figure of the drawings), can be held in place by one or more guide plates (e.g., like guide substrates 708 or 710 in FIG. 7 of guide plates 1316 in FIG. 13). Although also not shown, the pads 112 can be disposed on an electrically conductive structure (e.g., a pad or terminal) that is hard or otherwise not readily pierceable, and a probe 106 can pierce a pad 112 through to and thus contact and electrically connect to the non-pierceable pad. In such an embodiment, a probe 106 can thus make electrical connections with both the conductive elements inside a pad 112 and the electrically conductive non-pierceable pad on which the pad 112 is disposed.

The probes 106 can be electrically connected to first circuitry 104 of the first electronic device 102, and conductive elements 114 in the pads 112 can be electrically connected to second circuitry 110 of the second electronic device 108. The probes 106 and conductive elements 114 in the pads 112 can thus be part of the above-described continuous electrical paths (comprising the probes 106 piercing the pads 112), which can electrically connect the first circuitry 104 of the first electronic device 102 to the second circuitry 110 of the second electronic device 110. Non-limiting examples of electronic devices 102 and 108—which can be the same or different types of devices—include semiconductor devices (e.g., dies) and circuitry 104 and/or 110 can be active circuitry integrated into the dies; printed circuit boards; electrical sockets; test devices such as probe card assemblies or test sockets; or the like.

Conductive elements 114 can be any type of electrically conductive particle (which can include micro particles, flakes, spheres, or the like) or fiber (which can include filaments, strings, or the like), or the like. For example, conductive elements 114 can be metal (e.g., copper, silver, gold, carbon, or the like) particles, fibers, or the like.

Figure 2:
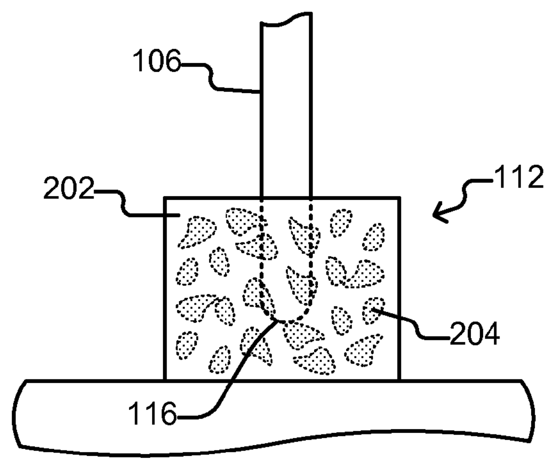
FIG. 2 illustrates an example of a pad comprising electrically conductive elements suspended in a electrically non-conductive material according to some embodiments of the invention.
Figure 3:
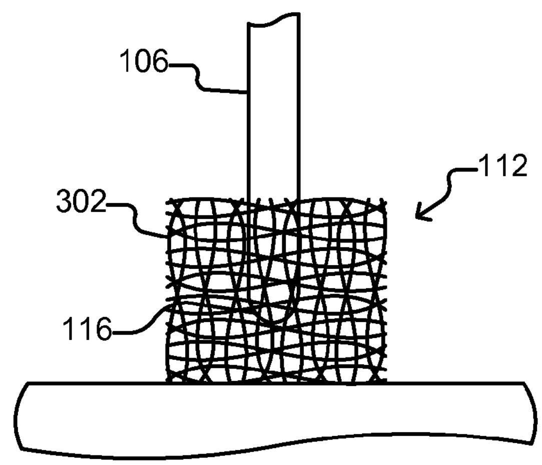
FIG. 3 illustrates an example of a pad comprising a bundle or column of intertwined electrically conductive elements according to some embodiments of the invention.

Pads 112 can be any structure that can be penetrated by probes 106. FIGS. 2 and 3 illustrate examples of a pad 112 according to some embodiments of the invention.

As shown in FIG. 2, in some embodiments, a pad 112 can comprise a non-conductive material 202 in which conductive elements 204 (which can the same as or similar to any of the examples of conductive elements 114 discussed above) are embedded or suspended. (Conductive elements 204 are thus examples of conductive elements 114 in FIGS. 1A and 1B.) The non-conductive material 202 can be compliant and easily pierced by a probe 106. For example, non-conductive material 202 can comprise elastomer, rubber, neoprene, silicone, or the like. In some embodiments, non-conductive material 202 can be self-healing such that the piercing mark into a pad 112 made by a probe 106 self heals after the probe 106 is removed. Suitable pads 112 include HXC125 Material System available from Tyco Electronics Corporation or similar material systems comprising conductive metal (e.g., copper, gold, silver, or the like) elements (e.g., flakes, spheres, or the like) in an elastomer (e.g., silicone).

FIG. 3 illustrates another example of a pad 112. As shown in FIG. 3, a pad 112 can comprises a mesh or bundle of conductive elements 302, which are examples of conductive elements 114 in FIGS. 1A and 1B. For example, conductive elements 302 can be intertwined metal (e.g., copper, silver, gold, or the like) fibers. As another example, conductive elements 302 can be carbon nanotubes.

The mesh or bundle of conductive elements 302 can be a standalone mesh or bundle generally as illustrated in FIG. 3. Alternatively, the mesh or bundle of conductive elements 302 can be embedded partially or completely in a material (e.g., like material 202 of FIG. 2).

Probes 106 can be any shape conducive to piercing a pad 112. For example, probes 106 can be generally elongated structures as illustrated in FIGS. 1A and 1B. The ends 116 of the probes 106 that pierce a pad 112 (hereinafter the "piercing ends") can likewise take any shape conductive to piercing a pad 112. Examples of suitable piercing ends 116 of probes 106 are illustrated in FIGS. 4, 5, 6A, and 6B according to some embodiments of the invention.

Figure 4:
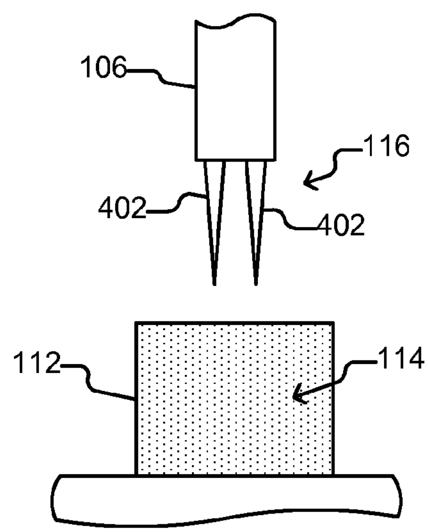
FIG. 4 illustrates an example of a probe with a piercing end comprising one or more spikes according to some embodiments of the invention.
Figure 5:
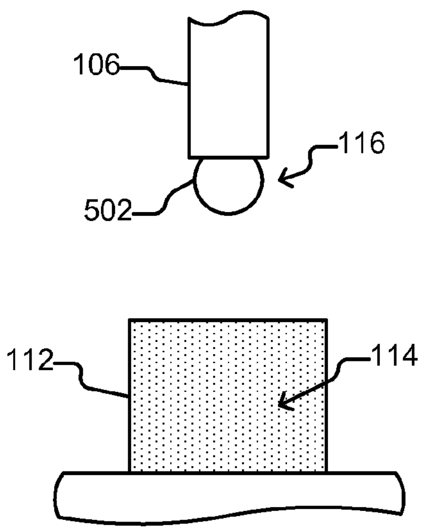
FIG. 5 illustrates an example of a probe with a piercing end comprising one or more balls according to some embodiments of the invention.
Figure 6A:
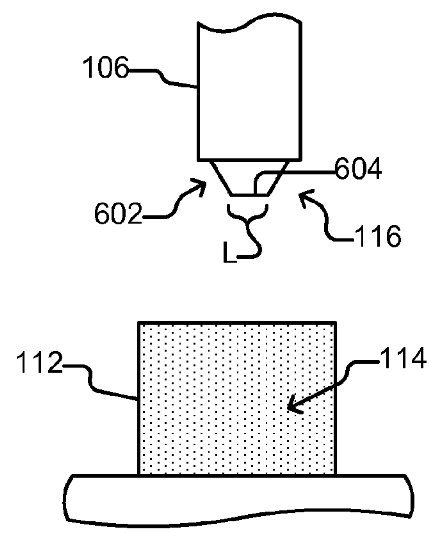
FIGS. 6A and 6B illustrate an example of a probe with a piercing end comprising one or more blades according to some embodiments of the invention.
Figure 6B:
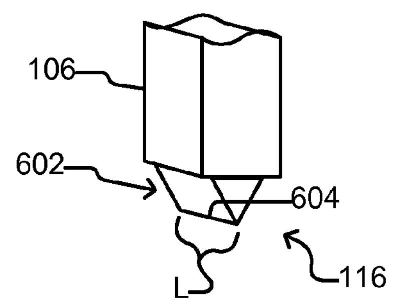

As shown in FIG. 4, the piercing end 116 of a probe 106 can comprise one or more spikes 402. Although two spikes 402 are shown in FIG. 4, there can be only one spike 402 or more than two spikes 402. FIG. 5 illustrates an example of a piercing end 116 of a probe 106 in the general shape of a ball 502. Again, although one ball 502 is shown, there can be more. FIGS. 6A and 6B illustrate yet another example of a piercing end 116 of a probe 106. As shown, the piercing end 116 can comprise a blade 602 with a cutting edge 604 having a length L. Again, although one blade 602 is shown, there can be more. Other non-limiting examples of a piercing end 116 of a probe 106 include needles or structures in the shape of a square, rectangle, pyramid, truncated pyramid, or the like.

Some embodiments of the electrical connections between the probes 106 and the conductive elements 114 (including electrical elements 204 and 302 in FIGS. 2 and 3) illustrated in FIG. 1B (or in any figure or discussion herein) can provide advantages over various prior art electrical connections.

For example, the material of the probes 106 and the conductive elements 114 of the pads 112 as well as the density of the conductive elements 114 in the pads 112 can be selected so that the contact resistance between a probe 106 and conductive elements 114 in a pad 112 pierced by the probe 106 is low. For example, in some embodiments, the contact resistance between a probe 106 and conductive elements 114 in a pad 112 can be less than ten ohms, less than one ohm, less than half an ohm, or less than ten milliohms. In other embodiments, however, the contact resistance can be ten ohms or more.

As another example, the material of the pads 112 and the material and shape of the piercing ends 116 of the probes 106 can be selected so that the force required for a probe 106 to pierce a pad 112 can be substantially low. For example, in some embodiments, the force required for the probe 106 to pierce a pad 112 to a depth D that is at least one quarter of the height H of the pad 112 (see FIG. 1B) can be less than ten grams, less than five grams, less than one gram, or less than one tenth of a gram. In other embodiments, however, that force can be ten grams or more. In some embodiments, the height H of a pad 112 can be at least five microns, at least ten microns, at least fifteen microns, at least twenty microns, at least fifty microns, or at least five-hundred microns. In other embodiments, the height H can be one or more millimeters. The depth D (see FIG. 1B) that a probe 106 penetrates into a pad 112 can be at least one tenth, at least one fifth, at least one quarter, at least one third, at least one half, or at least three quarters of the height H of the pad 112. For example, a probe 106 can penetrate into a pad 112 at least one micron, at least two microns, at least three microns, at least four microns, or at least five microns. In other embodiments, the depth D that a probe 106 penetrates into a pad 112 can be the entire height H of the pad 112 such that the probe 106 penetrates all the way through the pad 112. Of course, a probe 106 can alternatively pierce a pad 112 to a depth D that is less than a tenth of the height H of the pad 112 or less than one micron.

As yet another example of an advantage some embodiments of the invention can provide over the prior art, each of the probes 106 can pierce a corresponding pad 112 to a different depth D (which, as shown in FIG. 1B, can be less than the height H of a pad 112). This can compensate for irregularities in the lengths of the probes 106 and/or lack of planarity of one or both of the electronic devices 102 and 108.

A still further advantage of some embodiments of the invention is an ability to compensate for relative movement between the electronic devices 102 and 108. For example, compliance of the pads 112 can maintain the electrical connections between the probes 106 and the conductive elements 114 in the pads 112 even if the first electronic device 102 expands or contracts $E_1$ to a greater or lesser degree than the second electronic device 108 expands or contracts $E_2$ in response, for example, to temperature differences or changes.

As yet another advantage, the electrical connections between the first electronic device 102 and the second electronic device 108 in FIG. 1B can be easily removed by simply moving one of the electronic devices (e.g., 102) away from the other electronic device (e.g., 108) and thus pulling the probes 106 out of the pads 112. The electronic devices 102 and 108 can then readily be connected to another electronic devices. For example, the probes 106 of electronic device 102 can be pushed into—and thus pierce—the pads (e.g., like pads 112) of another electronic device (e.g., like the second electronic device 108). Although not shown, probes 106 and pads 112 can also be configured to connect pads 112 of an electronic device (e.g., device 102) to other pads (e.g., like pads 112) on the same electronic device, for example, in loopback testing or as a jumper. Although also not shown, pads 112 can also be configured in many well known electronic structures such as coaxial arrangements, triaxial arrangements, shielded differential pair arrangements, and the like.

As still another advantage, in some embodiments, it need not be necessary to compress pads 112 to form electrical connections with the probes 106. Thus, although a pad 112 can be compressed, it need not be.

Figure 7:
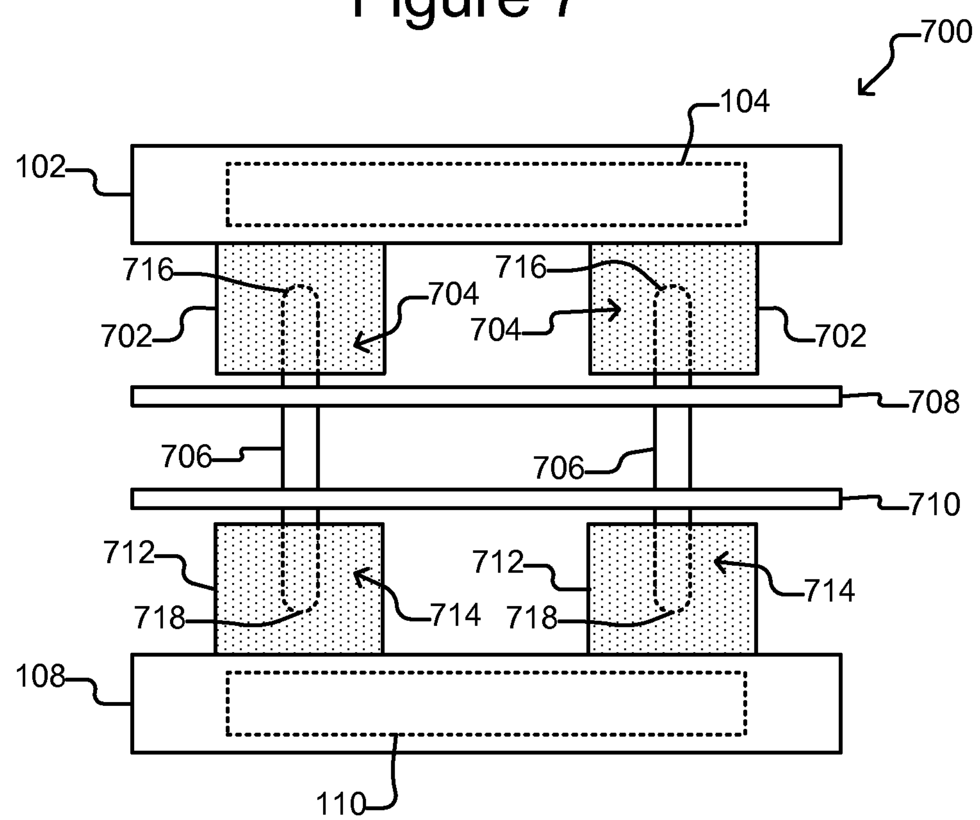
FIGS. 7, 8, and 9 illustrate examples of an electronic apparatus comprising electronic devices electrically connected by electrical paths that include a probe piercing a pad comprising electrically conductive elements according to some embodiments of the invention.
Figure 8:
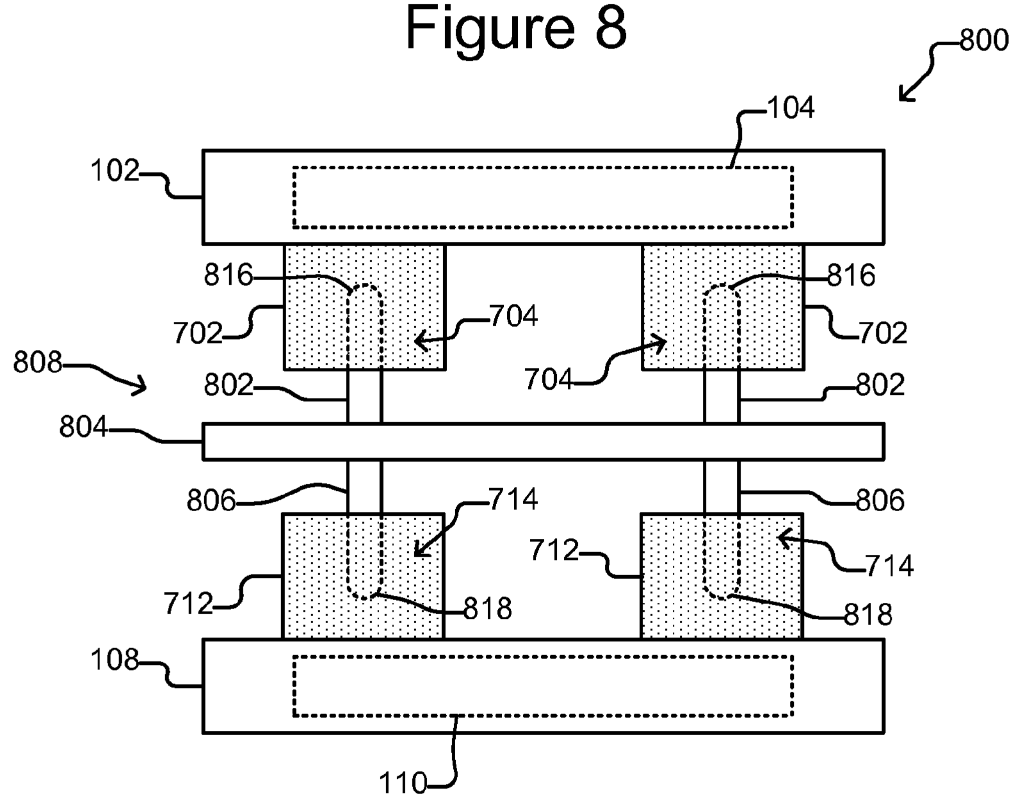
Figure 9:
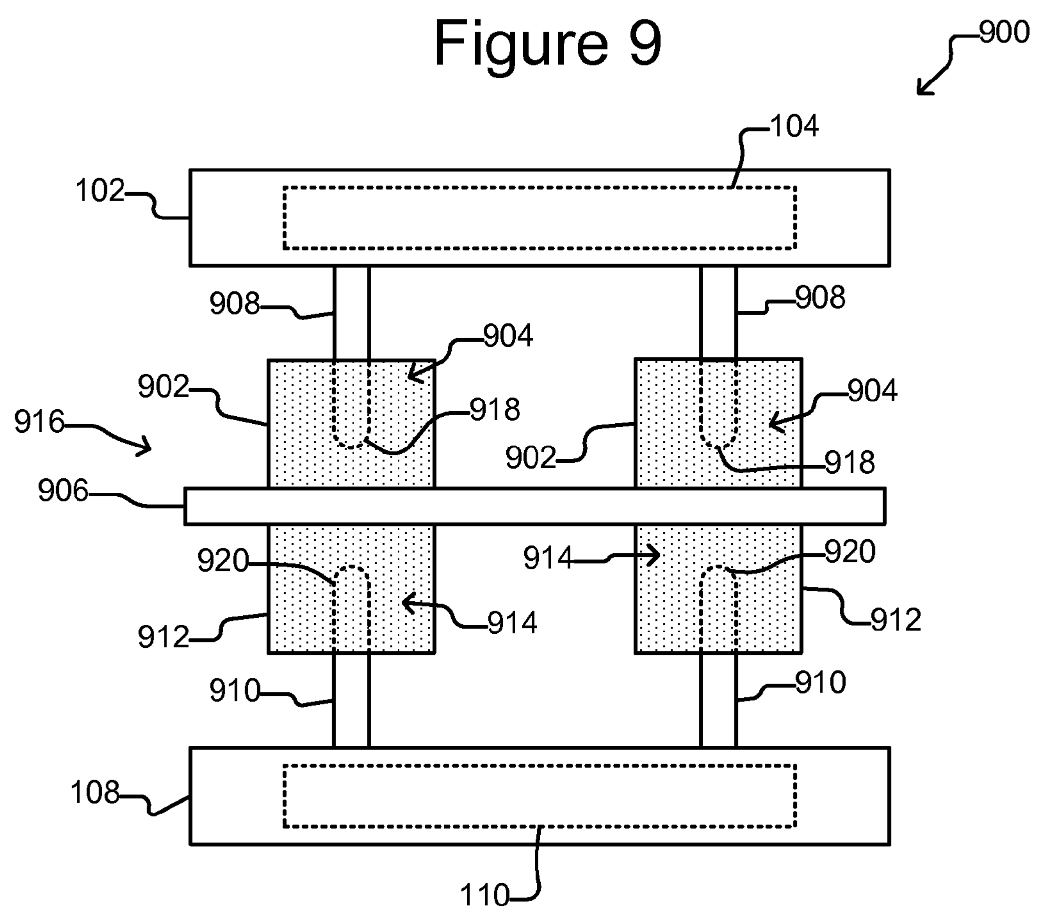
Figure 10:
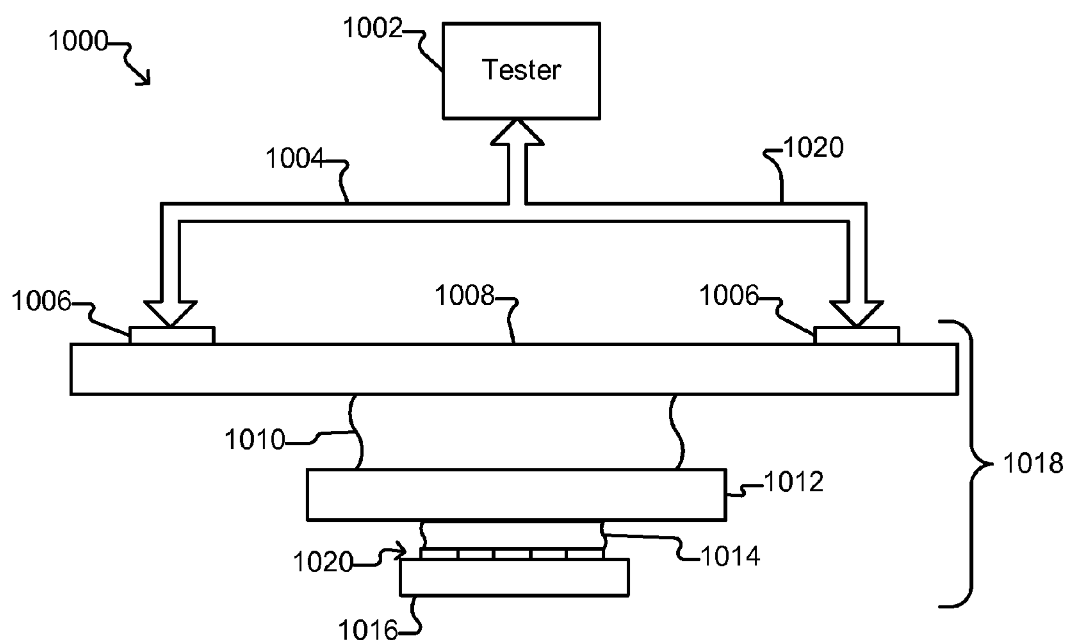
FIG. 10 illustrates a test system comprising a probe card assembly in which one or more connectors can include electrical connections comprising a probe piercing a pad comprising electrically conductive elements according to some embodiments of the invention.
Figure 11:
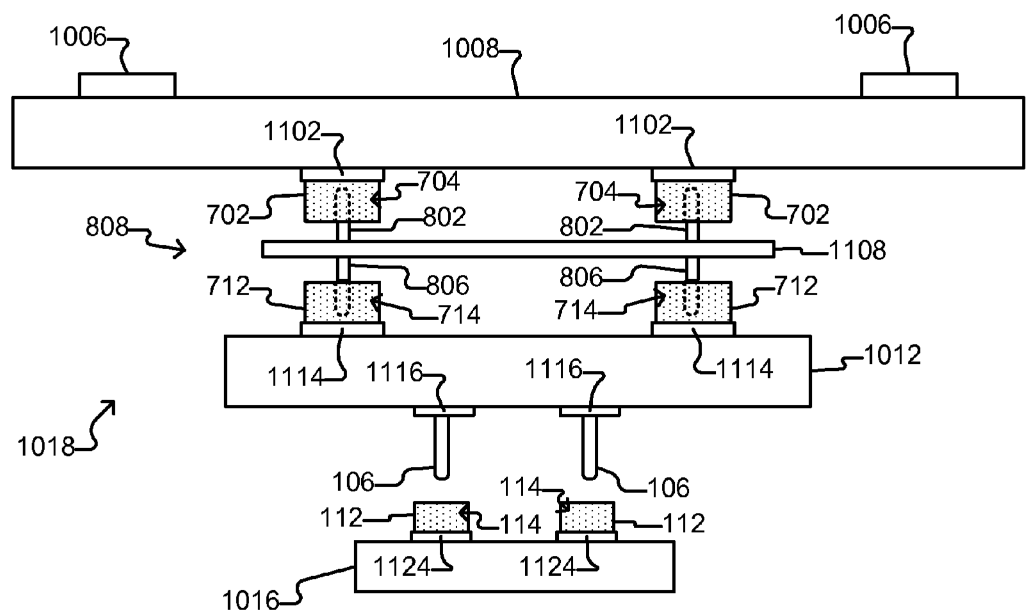
FIG. 11 illustrates an example of a probe card assembly showing examples of electrical connections comprising a probe piercing a pad comprising electrically conductive elements according to some embodiments of the invention.
Figure 12:
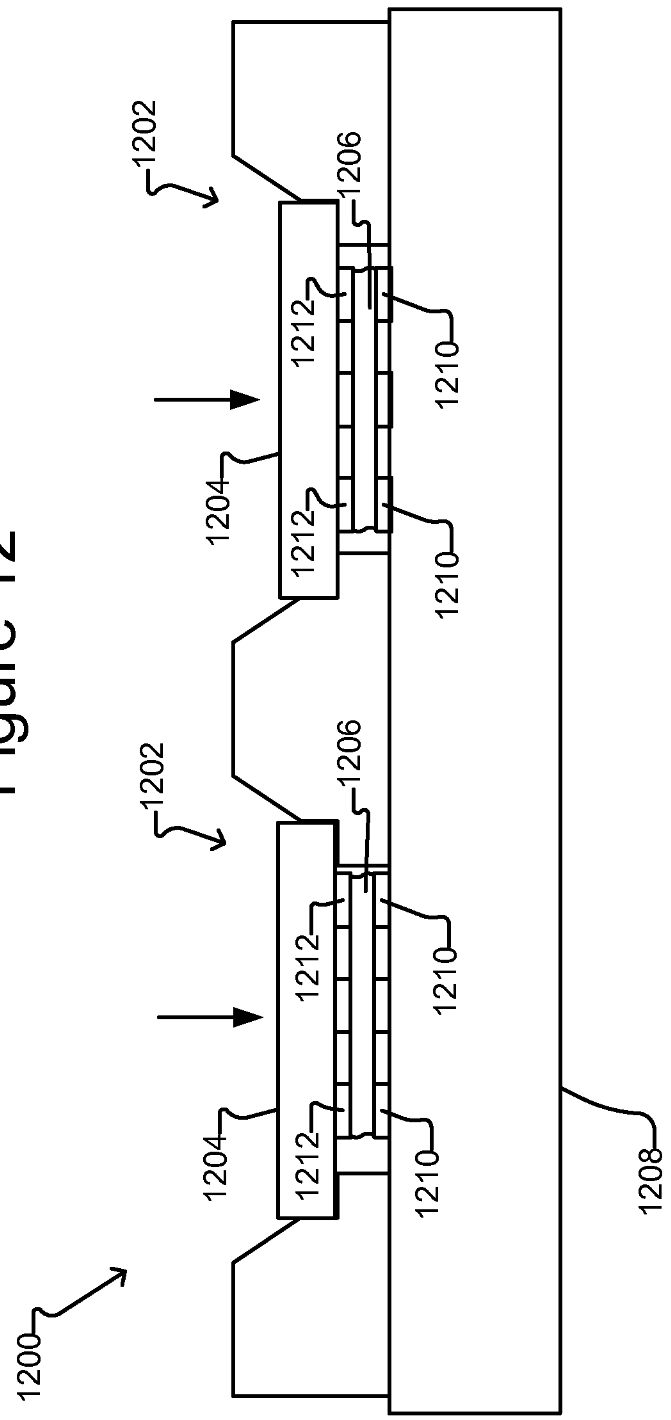
FIG. 12 illustrates an electrical socket in which one or more connectors can include electrical connections comprising a probe piercing a pad comprising electrically conductive elements according to some embodiments of the invention.

The electrical apparatus 100 shown in FIG. 1B in which probes 106 and conductive elements 114 in pads 112 are part of electrical paths between circuitry 104 of a first electronic device 102 and circuitry 110 of a second electronic device 108 is an example only. There are other configurations and applications for electrical connections comprising probes 106 piercing pads 112 and contacting conductive elements 114 in the pads. FIGS. 7-9 illustrate alternative embodiments in which a first electronic device 102 is connected to a second electronic device 108 by electrical paths that include a probe piercing a pad comprising conductive elements, and FIGS. 10-12 illustrate examples of applications in which such electrical connections can be used.

FIG. 7 illustrates an electrical apparatus 700 comprising the first electronic device 102 with circuitry 104 and the second electronic device 108 with circuitry 110 as discussed above. As shown, pads 702 comprising conductive elements 704 can be disposed on (e.g., attached to) the first electronic device 102, and the conductive elements 704 can be electrically connected to circuitry 104. Pads 712 comprising conductive elements 714 can similarly be disposed on (e.g., attached to) the second electronic device 108, and the conductive elements 714 can be electrically connected to circuitry 110. The pads 702 and 712 can be the same as pads 112 (including any embodiment or variation of pads 112 illustrated in FIGS. 2 and 3 and/or described herein), and the conductive elements 704 and 714 can be the same as conductive elements 114 (including any embodiment or variation of pads 112 illustrated in FIGS. 2 and 3 and/or described herein).

As shown in FIG. 7, piercing ends 716 of probes 706 (which can be like probes 106) can pierce pads 702 and contact and thereby make electrical connections with conductive elements 704 inside the pads 702. Also shown, opposite piercing ends 718 of probes 706 can pierce pads 712 and contact and thereby make electrical connections with conductive elements 714 inside the pads 712. Electrically conductive paths (which can be electrically insulated one from another) can thus be provided from circuitry 104 of the first electronic device 102 to circuitry 110 of the second electronic device 108, and each of those conductive paths can comprise conductive elements 704 in a pad 702 in contact with one piercing end 716 of a probe 706, the probe 706, and conductive elements 714 in a pad 712 in contact with an opposite piercing end 718 of the probe 706. The piercing end 716 and the opposite piercing end 718 of a probe 706 can be the same as a piercing end 116 of a probe 106 as described herein including having any of the piercing end configurations 116 illustrated in FIGS. 4-6B. One or more guide substrates 708 and 710 (two are shown but there can be more or fewer including none) can hold the probes 706 in place.

FIG. 8 illustrates an electrical apparatus 800 that can be generally the same as the electrical apparatus 700 of FIG. 7 except that interposer 808 in FIG. 8 replaces probes 706 of FIG. 7. Interposer 808 can comprise a substrate 804, first probes 802 extending from a first side of the substrate 804, and second probes 806 extending from a second side of the substrate 804. Electrical connections (not shown) through the substrate 804 can connect individual ones of the first probes 802 with individual ones of the second probes 806.

As shown in FIG. 8, piercing ends 816 of the first probes 802 can pierce pads 702 and contact and thereby make electrical connections with conductive elements 704 inside the pads 702. Also shown, piercing ends 818 of the second probes 806 can pierce pads 712 and contact and thereby make electrical connections with conductive elements 714 inside the pads 712. Electrically conductive paths (which can be electrically insulated one from another) can thus be provided from circuitry 104 of the first electronic device 102 to circuitry 110 of the second electronic device 108, and each of those conductive paths can comprise conductive elements 704 in a pad 702 in contact with one piercing end 816 of a first probe 802, the first probe 802, an electrical connection through the substrate 804 from the first probe 802 to a second probe 806 whose piercing end 818 is in contact with conductive elements 714 in a pad 712, and the conductive elements 714 in the pad 712.

First probes 802 can be like probes 106, and second probes 806 can also be like probes 106. In addition, the piercing end 816 of a probe 802 and the piercing end 818 of a probe 806 can be the same as a piercing end 116 of a probe 106 as described herein including having any of the piercing end configurations 116 illustrated in FIGS. 4-6B.

FIG. 9 illustrates an electrical apparatus 900 comprising the first electronic device 102 with circuitry 104 and the second electronic device 108 with circuitry 110 as discussed above. As shown, the electrical apparatus 900 can also comprise an interposer 916, which can comprise a substrate 906, first pads 902 comprising conductive elements 904 disposed on (e.g., attached to) a first side of the substrate 906, and second pads 912 comprising conductive element 914 disposed on (e.g., attached to) a second side of the substrate 906. The pads 902 and 912 can be the same as pads 112 (including any embodiment or variation of pads 112 illustrated in FIGS. 2 and 3 and/or described herein), and the conductive elements 904 and 914 can be the same as conductive elements 114 (including conductive elements 202 and 302 illustrated in FIGS. 2 and 3 and/or described herein). Electrical connections (not shown) through the substrate 906 can connect conductive elements 904 in individual ones of the first pads 902 with conductive elements 914 in individual ones of the second pads 912.

As also shown in FIG. 9, first probes 908 (which can be like probes 106) can extend from the first electronic device 102, and second probes 910 (which can be like probes 106) can extend from the second electronic device 108. The first probes 908 can be electrically connected to circuitry 104, and the second probes 910 can be electrically connected to circuitry 110. As shown, piercing ends 918 of the first probes 908 can pierce the first pads 902 and contact and thereby make electrical connections with conductive elements 904 inside the first pads 902. As also shown, piercing ends 920 of the second probes 910 can pierce the second pads 912 and contact and thereby make electrical connections with conductive elements 914 inside the second pads 912. Electrically conductive paths (which can be electrically insulated one from another) can thus be provided from circuitry 104 of the first electronic device 102 to circuitry 110 of the second electronic device, and each of those conductive paths can comprise a first probe 908, conductive elements 904 in a first pad 902, an electrical connection through the substrate 916 from the conductive elements 904 of the first pad 902 to the conductive elements of a second pad 912, and a probe 910 piercing the second pad 912.

There are many possible uses and applications for electrical connections that comprise probes (e.g., 106) piercing pads (e.g., 112) comprising conductive elements (e.g., 114) as disclosed herein. FIGS. 10-12 illustrate examples.

FIG. 10 illustrates test system 1000 that includes a probe card assembly 1018 for testing DUT 1016. DUT 1016 (which can be an acronym for device under test) can be any electronic device or devices to be tested, including without limitation one or more dies of an unsingulated semiconductor wafer, one or more semiconductor dies singulated from a wafer (packaged or unpackaged), one or more dies of an array of singulated semiconductor dies disposed in a carrier or other holding device, one or more multi-die electronic devices, one or more printed circuit boards, or any other type of electronic device or devices. FIG. 10 shows an exemplary probe card assembly 1018 and a simplified block diagram of a test system 1000 in which the probe card assembly 1018 can be used to test DUT 1016 according to some embodiments of the invention.

As shown in FIG. 10, the probe card assembly 1018 can comprise a wiring substrate 1008, an interconnector 1010, and a probe head 1012, which can be held together by brackets (not shown) and/or other suitable means. As also shown, an interconnector 1014 can be provided between the probe head 1012 and terminals 1020 of the DUT 1016. The interconnector 1014, which can be located in part on the probe head 1012 and in part on the DUT 1016, can electrically connect the probe head 1012 to the terminals 1020 of the DUT 1016.

The wiring substrate 1008 can be a printed circuit board, ceramic substrate, or the like. The wiring substrate 1008 can include electrical connectors 1006 (e.g., an electrical interface to a tester 1002) configured to make electrical connections with a plurality of communications channels 1004 to and from a tester 1002. Connectors 1006 can be pads for receiving pogo pins, zero-insertion-force connectors, or any other electrical connection device suitable for making electrical connections with communications channels 1004. Electrically conductive paths (not shown) can be provided through the probe card assembly 1018 to provide electrical connections from individual electrical connections in connectors 1006 (each such individual electrical connection can correspond to one of communication channels 1004) to input and/or output terminals 1020 of the DUT 1016. Those conductive paths (not shown) through the probe card assembly 1018 can comprise electrically conductive connections, such as traces and/or vias (not shown), from the connectors 1006 through the wiring substrate 1008 to the interconnector 1010; the interconnector 1010; electrically conductive connections, such as traces and vias (not shown), through the probe head 1012; and interconnector 1014. In this way, a plurality of signal paths comprising the communications channels 1004 and the above-described conductive paths through the probe card assembly 1018, are provided between the tester 1002 and the input and/or output terminals 1020 of DUT 1016.

The interconnector 1010 and/or the interconnector 1014 can comprise probes (e.g., 106) piercing pads (e.g., 112) comprising conductive elements (e.g., 114). FIG. 11 illustrates an example of the probe card assembly 1018 in which the interconnector 1010 is implemented by the interposer 808 and pads 702 and 712 in FIG. 8, and the interconnector 1014 is implemented by the probes 106 and the pads 112 illustrated in FIG. 1B.

As shown in FIG. 11, the pads 702 of the interposer 808 of FIG. 8 can be disposed on (e.g., attached to) electrical terminals 1102 of the wiring substrate 1008. The conductive elements 704 in pads 702 can thus be electrically connected to the terminals 1102. The pads 712 of the interposer 808 can similarly be disposed on (e.g., attached to) electrical terminals 1114 of the probe head 1012, and the conductive elements 714 of the pads 712 can thus be electrically connected to the terminals 1114. The wiring substrate 1008 of FIG. 11 can thus be an example of the first electronic device 102 in FIG. 8, and the electrical connectors 1006, the terminals 1102, and electrical connections (not shown), such as vias and/or traces (not shown), through the wiring substrate 1008 between the connectors 1006 and the terminals 1102 can be an example of the circuit 104 in FIG. 8. The probe head 1012 can similarly be an example of the second electronic device 108 in FIG. 8, and the terminals 1114 and 1116 and electrical connections (not shown), such as vias and/or traces (not shown), through the probe head 1012 between the terminals 1114 and 1116 can be an example of the circuit 110 in FIG. 8.

As also shown in FIG. 11, the probes 106 of FIG. 1B can be disposed on (e.g., attached to) electrical terminals 1116 of the probe head 1012. The pads 112 of FIG. 1B can similarly be disposed on (e.g., attached to) electrical terminals 1124 of the DUT 1016, and the conductive elements 114 of the pads 112 can thus be electrically connected to the terminals 1124. The probe head 1012 of FIG. 11 can thus be an example of the first electronic device 102 in FIG. 1B, and the terminals 1114 and 1116 and electrical connections (not shown), such as vias and/or traces (not shown), through the probe head 1012 between the terminals 1114 and 1116 can be an example of the circuit 104 in FIG. 1B. The DUT 1016 can similarly be an example of the second electronic device 108 in FIG. 1B, and the terminals 1124 and internal circuitry (not shown) of DUT 1016 can be an example of the circuit 110 in FIG. 8. In the foregoing example, the probes 106 extending from the probe head 1012 can be examples of contacts of the probe head configured to electrically connect to terminals 1020 of the DUT 1016.

The configuration of the probe card assembly 1018 illustrated in FIG. 11 is an example only, and variations are possible. For example, pads 112 can alternatively be disposed on terminals 1116 of the probe head 1012 and probes 106 can be disposed on terminals 1124 of the DUT 1016. In the foregoing example, the pads 112 disposed on terminals 1116 of the probe head 1012 can be examples of contacts of the probe head configured to electrically connect to terminals 1020 of the DUT 1016. As other examples, the interconnector 1010 of FIG. 10 can alternatively be implemented as the probes 706 and the pads 702 and 712 shown in FIG. 7, or the interposer 916 and probes 908 and 910 in FIG. 9. As still other examples, the interconnector 1014 of FIG. 10 can alternatively be implemented as the probes 706 and the pads 702 and 712 shown in FIG. 7; the interposer 808 and pads 702 and 712 in FIG. 8; or the interposer 916 and probes 908 and 910 in FIG. 9. As yet other examples, the interconnector 1010 and/or the interconnector 1014 can be implemented by means other than a probe (e.g., 106) piercing a pad (e.g., 112) comprising conductive elements (e.g., 114).

Regardless of how the probe card assembly 1018 is configured, the DUT 1016 can be tested using the test system 1000 of FIG. 10 as follows. Terminals 1020 of the DUT 1016 can be electrically connected to interconnector 1014. The tester 1002 can generate test signals, which can be provided through the communications channels 1004, probe card assembly 1018, and interconnector 1014 to terminals 1020 of the DUT 1016. Response signals generated by the DUT 1016 can be provided from the DUT 1016 through the interconnector 1014, probe card assembly 1018, and channels 1004 to the tester 1002. The tester 1002 can analyze the response signals to determine whether DUT 1016 responded properly to the test signals and, consequently, whether DUT 1016 passes or fails the testing. The tester 1002 can alternatively or in addition rate the performance of DUT 1016.

FIG. 12 illustrates an exemplary socket 1200 having a wiring substrate 1208 with device sites 1202 for electronic devices 1204. Interconnectors 1206 can electrically connect electrical terminals 1212 of each electronic device 1204 to electrical terminals 1210 of the wiring substrate 1208. The wiring substrate 1208 can include electrical connections (not shown) that electrically connect the terminals 1210 to interfaces (not shown) and/or other electronic devices (not shown).

The interconnectors 1206 can comprise probes (e.g., 106) piercing pads (e.g., 112) comprising conductive elements (e.g., 114). For example, the interconnectors 1206 can be implemented by the probes 106 and pads 112 of FIG. 1B. In such a case, the probes 106 of FIG. 1B can be disposed on (e.g., attached to) and thus electrically connected to either the terminals 1212 of the electronic devices 1204 or the terminals 1210 of the wiring substrate 1208. The pads 112 of FIG. 1B can similarly be disposed on (e.g., attached to) and the conductive elements 114 of the pads thus electrically connected to the other of terminals 1212 of the electronic devices 1204 or the terminals 1210 of the wiring substrate 1208. In the foregoing examples, an electronic device 1204 of FIG. 12 can correspond to one of first electronic device 102 or the second electronic device 108 in FIG. 1B, and the wiring substrate 1208 can correspond to the other of the first electronic device 102 or the second electronic device 108. The terminals 1212 and internal circuitry (not shown) of an electronic device 1204 can thus correspond to the circuitry 104 or 110 in FIG. 1B, and the terminals 1208 and internal electrical connections (not shown) of the wiring substrate 1208 can correspond to the other of the circuitry 104 or 110.

As other examples, the interconnectors 1206 of FIG. 12 can be implemented as the probes 706 and the pads 702 and 712 shown in FIG. 7; the interposer 808 and pads 702 and 712 in FIG. 8; or the interposer 916 and probes 908 and 910 in FIG. 9. In such cases, an electronic device 1204 can correspond to the first electronic device 102 in FIG. 7, 8, or 9, and the wiring substrate 1208 can correspond to the second electronic device 108. The terminals 1212 and internal circuitry (not shown) of an electronic device 1204 can thus correspond to the circuitry 104 in FIG. 1B, and the terminals 1208 and internal electrical connections (not shown) of the wiring substrate 1208 can correspond to the circuitry 110.

Figure 13:
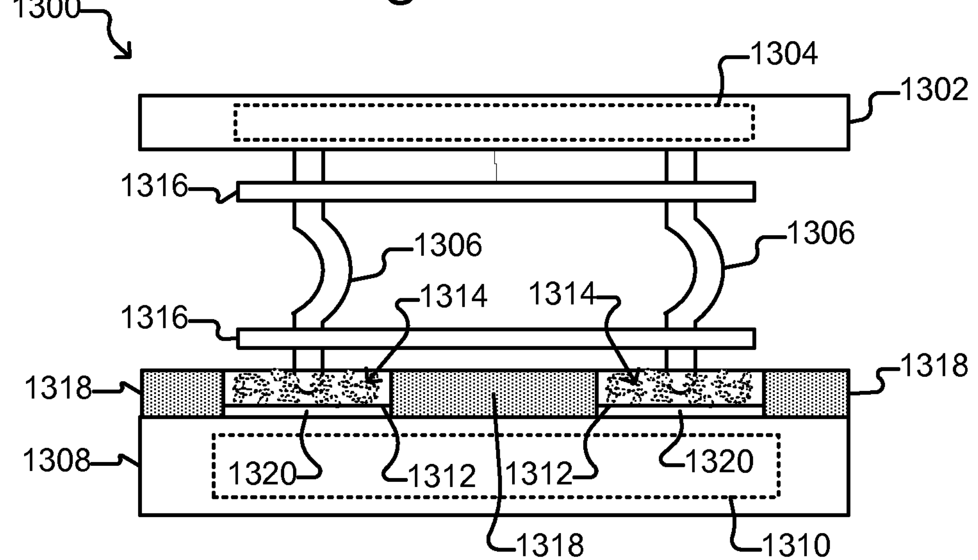
FIG. 13 illustrates another embodiment of an electronic apparatus comprising electronic devices electrically connected by electrical paths that include a probe piercing a pad comprising electrically conductive elements according to some embodiments of the invention.

FIG. 13 illustrates another embodiment of an electronic apparatus comprising electronic devices electrically connected by electrical paths that include a probe piercing a pad comprising electrically conductive elements according to some embodiments of the invention. As shown, an electronic apparatus 1300 can comprise a semiconductor die or wafer 1302 (which can comprise a plurality of unsingulated dies) having circuitry 1304. (The die or wafer 1302 can be an example of a first or a second electronic device, and circuitry 1304 can be an example of first or second circuitry.) For example, circuitry 1304 can be active circuitry integrated into the die or wafer 1302. Probes 1306 (which can be generally like probes 106) can extend from the die or wafer 1302 and be electrically connected to circuitry 1304. Guide plates 1316 (two are shown but there can be more or fewer) can stabilize and/or hold the probes 1306 in place.

Pads 1312 can be disposed on electrically conductive terminals 1320 of an electronic device 1308. The terminals 1320 can be electrically connected to circuitry 1310 of the electronic device 1308. (The electronic device 1308 can be an example of a first or a second electronic device, and circuitry 1310 can be an example of first or second circuitry.) Each pad 1312 can be similar to the embodiment of pad 112 shown in FIG. 2 and can thus comprise electrically conductive elements 1314 (which can be like conductive particles 204 in FIG. 2) embedded in a non-electrically conductive material (e.g., like material 202 in FIG. 2). The conductive particles 1314 can be electrically connected to the terminal 1320. As shown ends (which can be like piercing ends 116 of the probes 106) of probes 1306 can pierce the pads 1312. A non-electrically conductive material 1318 can be disposed between the pads 1312 generally as shown.

Each probe 1306 can pierce a pad 1312. The probe 1306 can thus contact and thereby make multiple electrical connections with ones of the conductive particles 1314 inside a pad 1312. Electrically conductive paths (which can be electrically insulated one from another) can thus be formed from the circuitry 1304 of the die or wafer 1302 to the circuitry 1310 of the electronic device 1308. Each such conductive path can comprise a probe 1306 contacting and making electrical connections with conductive particles 1314 in a pad 1312 and a terminal 1320.

Although specific embodiments and applications of the invention have been described in this specification, these embodiments and applications are exemplary only, and many variations are possible.

I claim:

1. An electronic apparatus comprising:

a first electronic device comprising first circuitry;

a second electronic device comprising second circuitry;

compliant pads disposed on said second electronic device, each of said compliant pads comprising a non-electrically conductive compliant material and conductive elements suspended inside said compliant material and electrically connected directly to said second circuitry; and electrically conductive probes extending from said first electronic device and piercing ones of said pads, each of said probes are electrically connected directly to said first circuitry and contact ones of said conductive elements suspended inside said pad pierced by said probe; and electrical paths from said first circuitry to said second circuitry, wherein each of said electrical paths comprises one of said probes and said ones of said conductive elements suspended inside said one of said pads pierced by said one of said probes.

2. The electronic apparatus of claim 1, wherein said compliant material is substantially elastic.

3. The electronic apparatus of claim 1, wherein said compliant material comprises a polymer material or a plastic material.

4. The electronic apparatus of claim 1, wherein:

said conductive elements are electrically conductive fibers, and each of said pads comprises a mesh or bundle of said fibers.

5. The electronic apparatus of claim 1, wherein each of said probes comprises a spike that pierces one of said pads.

6. The electronic apparatus of claim 5, wherein each of said probes comprises a plurality of spikes that pierce one of said pads.

7. The electronic apparatus of claim 1, wherein each of said probes comprises one or more blades that pierce one of said pads.

8. The electronic apparatus of claim 1, wherein each of said probes comprises a ball that pierces one of said pads.

9. The electronic apparatus of claim 1, wherein:

one of said first electronic device or said second electronic device is a semiconductor device and said first circuitry comprises active circuitry integrated into said semiconductor device, and the other of said first electronic device or said second electronic device is a socket for receiving said semiconductor device.

10. The electronic apparatus of claim 1, wherein:

one of said first electronic device or said second electronic device is a semiconductor device and said first circuitry comprises active circuitry integrated into said semiconductor device, and the other of said first electronic device or said second electronic device is a probe card assembly configured to make temporary electrical connections with said semiconductor device to test said semiconductor device.

11. The electronic apparatus of claim 10, wherein:

said pads are disposed on said semiconductor device, and said probes are part of said probe card assembly, and said probes comprise piercing ends that pierce said pads.

12. The electronic apparatus of claim 1, wherein said conductive elements are dispersed throughout said compliant material.

13. The electronic apparatus of claim 1, wherein said conductive elements are of sufficient density inside each of said pads to form electrical connections with said one of said probes that pierces said pad.

14. The electronic apparatus of claim 1, wherein said conductive elements comprise particles, flakes, spheres, or fibers.

15. The electronic apparatus of claim 1, wherein said non-conductive material of each of said pads is self-healing.

16. The electronic apparatus of claim 1, wherein:

one of said pads extends a height H from said second device, a force of less than one gram presses one of said probes a distance D into said one of said pads, and D is at least one half of H.

17. The electronic apparatus of claim 16, wherein D is at least three quarters of H.

18. The electronic apparatus of claim 1, wherein:

each of said pads extends at least a height H from said second device, and each of said probes extends less than said height H into a corresponding one of said pads.

19. The electronic apparatus of claim 1, wherein:

one of said pads extends a height H from said second device, and one of said probes pierces into said one of said pads a distance D equal to said height H.

20. The electronic apparatus of claim 1, wherein:

each of said pads extends at least a height H from said second device, and each of a plurality of said probes extends a different distance D into said pads.

* * * * *